United States Patent
Mellinger et al.

(10) Patent No.: US 9,306,390 B2
(45) Date of Patent: Apr. 5, 2016

(54) DISTRIBUTED ELECTROSTATIC DISCHARGE PROTECTION FOR AN ON-PACKAGE INPUT/OUTPUT ARCHITECTURE

(75) Inventors: Todd W. Mellinger, Fort Collins, CO (US); Michael E. Griffith, Fort Collins, CO (US); Ganesh Balamurugan, Hillsboro, OR (US); Thomas P. Thomas, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 108 days.

(21) Appl. No.: 13/995,111

(22) PCT Filed: Dec. 22, 2011

(86) PCT No.: PCT/US2011/066985
§ 371 (c)(1),
(2), (4) Date: Jun. 17, 2013

(87) PCT Pub. No.: WO2013/095545
PCT Pub. Date: Jun. 27, 2013

(65) Prior Publication Data
US 2014/0204490 A1    Jul. 24, 2014

(51) Int. Cl.
*H02H 9/04* (2006.01)
*H01L 27/02* (2006.01)
*H03K 19/003* (2006.01)
*G06F 1/16* (2006.01)

(52) U.S. Cl.
CPC .............. *H02H 9/046* (2013.01); *G06F 1/1613* (2013.01); *H01L 27/0255* (2013.01); *H03K 19/00361* (2013.01)

(58) Field of Classification Search
CPC .............................. H02H 9/046; G06F 1/1613
USPC ................................................ 361/56, 679.56
See application file for complete search history.

(56) References Cited

U.S. PATENT DOCUMENTS

| 6,246,721 B1 | 6/2001 | Zhang |
| 6,724,223 B2 | 4/2004 | Ichiguchi et al. |
| 6,998,870 B1 | 2/2006 | Gulick et al. |
| 7,205,787 B1 | 4/2007 | Massoumi et al. |

(Continued)

FOREIGN PATENT DOCUMENTS

| CN | 1459796 A | 10/2003 |
| CN | 101136401 | 3/2008 |

(Continued)

OTHER PUBLICATIONS

International Search Report and Written Opinion for PCT/US2011/066985 mailed Sep. 26, 2012, 11 pages.

(Continued)

*Primary Examiner* — Scott Bauer
(74) *Attorney, Agent, or Firm* — Blakely, Sokoloff, Taylor & Zafman LLP

(57) ABSTRACT

An on-package interface. A first set of single-ended transmitter circuits on a first die. A first set of single-ended receiver circuits on a second die. The receiver circuits have a termination circuit comprising an inverter and a resistive feedback element. A plurality of conductive lines couple the first set of transmitter circuits and the first set of receiver circuits. The lengths of the plurality of conductive lines are matched.

12 Claims, 6 Drawing Sheets

(56) References Cited

U.S. PATENT DOCUMENTS

| | | | |
|---|---|---|---|
| 2003/0180988 A1 | 9/2003 | Kikuma et al. | |
| 2005/0200380 A1 | 9/2005 | Rapport | |
| 2007/0250765 A1 | 10/2007 | Chen et al. | |
| 2008/0018357 A1 | 1/2008 | Peterson | |
| 2008/0320247 A1 | 12/2008 | Morfey et al. | |
| 2011/0150135 A1* | 6/2011 | Singor | 375/316 |
| 2011/0249369 A1 | 10/2011 | Rueger | |

FOREIGN PATENT DOCUMENTS

| | | |
|---|---|---|
| TW | 201110534 | 3/2011 |
| WO | WO-9510855 | 4/1995 |

OTHER PUBLICATIONS

International Preliminary Report on Patentability for PCT/US2011/066985 mailed Jul. 3, 2014, 8 pages.

Office Action and Search Report for Taiwan Patent Application No. 101143267 mailed Dec. 17, 2014, 12 pages.

Thomas, Thomas P., "On-Package Input/Output Architecture", Non Final Office Action mailed on Oct. 6, 2015 in Related U.S. Appl. No. 13/995,007, filed Jun. 17, 2013.

Shockman, Paul, "Termination of ECL Logic Devices". Application Note AND8020/D. Revision 2. On Semiconductor. May 2002.

First Action mailed on Dec. 2, 2015 in counterpart Chinese Patent Application No. 201190075832.4, p. 6 English Translation of the art cited in the Office Action, 7 pages total.

* cited by examiner

DISTRIBUTED ELECTROSTATIC DISCHARGE PROTECTION FOR AN ON-PACKAGE INPUT/OUTPUT ARCHITECTURE

TECHNICAL FIELD

Embodiments of the invention relate to input/output architectures and interfaces. More particularly, embodiments of the invention relate to high-bandwidth on-package input/output architectures and interfaces.

BACKGROUND

High bandwidth interconnections between chips using conventional input/output (I/O) interfaces require significant power and chip area. Thus, in applications requiring significantly reduced power consumption and/or smaller chip area, these conventional interfaces are not desirable.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Described herein is an On-Package I/O (OPIO) interface that solves the problems of conventional I/O interfaces by providing very high bandwidth I/O between chips in a Multi Chip Package (MCP) with very low power, area and latency. OPIO may be useful, for example, to interconnect a processor to memory (eDRAM/DRAM), another processor, a chip set, a graphics processor, or any other chip in a MCP with an order of magnitude lower energy per bit and area per bandwidth compared to conventional I/O.

Various embodiments of the interfaces described herein include one or more of the following components: (1) a single-ended, high-speed I/O interface (e.g., CMOS interface) between IC chips in a MCP with a relatively small die-to-die gap; (2) an impedance matched transmitter (e.g., CMOS transmitter) with no receiver termination or very weak termination, and no equalization; (3) a forwarded clock signal for a cluster of signals with length-matched routing to minimize or eliminate per pin de-skew; and/or (4) reduced electrostatic discharge (ESD) protection (e.g., 70 V) to provide lower pad capacitances and higher data rates.

Close chip assembly in MCP enables very short length matched I/O traces, which in turn enables OPIO architectures described herein to run at high bandwidth using simplified single-ended I/O and clocking circuits to reduce power, area and latency. In one embodiment, high-speed, single-ended I/O with minimum bump pitch reduces bump limited silicon area for required bandwidth.

In one embodiment, use of a CMOS transmitter and receiver with no or weak receiver termination and no equalization can reduce I/O power. In another embodiment, where distance between chips is longer, optional weak to fully matched receiver termination is enabled to achieve high data rate at the expense of I/O power. Simplified clocking with forwarded clock per cluster of signals and no per pin de-skew can be achieved due to careful length matched routing reduces clock power. Thus, the OPIO architectures described herein provide high bandwidth between chips at very low power, area and latency. MCP with OPIO provides product, process and die area flexibility without significant power and area overhead. The OPIO architectures described herein can also be extended to close discrete packages with full ESD protection for small form factor mobile applications at lower data rates. Multi-level (e.g., M-PAM) signaling can be used at higher data rates to keep the clock frequency down.

Figure 1:
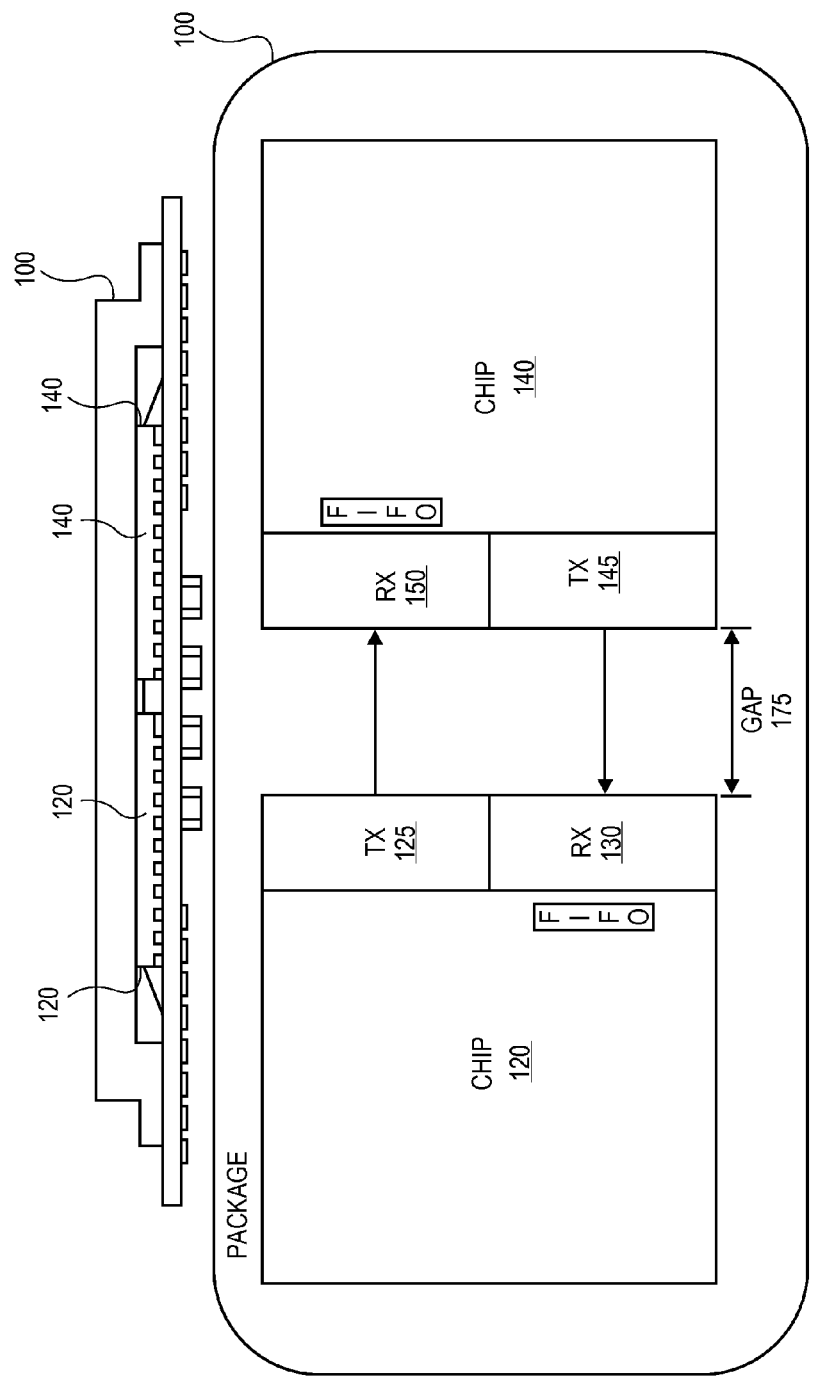
FIG. 1 is a block diagram of one embodiment of a multi-chip package (MCP) having on-package input/output (OPIO) interfaces between at least two chips.

FIG. 1 is a block diagram of one embodiment of a multi-chip package (MCP) having on-package input/output (OPIO) interfaces between at least two chips. The example of FIG. 1 illustrates two chips with interfaces; however, any number of chips within a package can be interconnected using the techniques described herein.

Package 100 may be any type of package that may contain multiple integrated circuit chips. In the example of FIG. 1, package 100 contains chip 120 and chip 140. These chips may be, for example, processors, memory chips, graphics processors, etc.

In one embodiment, chip 120 includes OPIO transmitters 125 and OPIO receivers 130. Similarly, chip 140 includes OPIO transmitters 145 and OPIO receivers 150. Transmitters 125 are coupled with receivers 150 and transmitters 145 are coupled with receivers 130.

In one embodiment, gap 175 between chip 120 and chip 140 is relatively small. In one embodiment, gap 175 is less than 20 mm. In one embodiment, gap 175 is less than 10 mm. In one embodiment, gap 175 is approximately 1.5 mm. In other embodiments, gap 175 may be less than 1.5 mm. In general, the smaller gap 175, the greater the bandwidth that may be provided between chips.

In one embodiment, the interfaces between transmitter 125 and receiver 150, and between transmitter 145 and receiver 130 are single-ended, relatively high-speed interfaces. In one embodiment, the interfaces are CMOS interfaces between chip 120 and chip 140. In one embodiment, transmitters 125 and 145 are impedance matched CMOS transmitters and no termination or equalization is provided. In one embodiment, transmitters 125 and 145 are impedance matched CMOS transmitters and very weak termination and no equalization is provided.

In one embodiment, a forwarded clock signal is transmitted for a cluster of signals. In one embodiment, length-matched routing is provided between the transmitters and the receivers. In one embodiment, minimal electrostatic discharge (ESD) protection (as little as 70 Volts) is provided for the interfaces between chips 120 and 140.

In one embodiment, use of a CMOS transmitter and receiver with no or weak receiver termination and no equalization can reduce I/O power. Simplified clocking with forwarded clock per cluster of signals and no per pin de-skew can be achieved due to careful length matched routing reduces clock power. Thus, the architectures described herein provide high bandwidth between chips at very low power, area and latency.

The architectures described herein can also be extended to close discrete packages with full ESD protection for small form factor mobile applications at lower data rates. Multilevel (e.g., M-PAM) signaling can be used at higher data rates to keep the clock frequency down.

Under certain conditions, the interface of FIG. 1 may benefit from termination. However, conventional center-tap termination (CCTs) implemented using passive resistors consume static power and degrade I/O power efficiency. CCTs also typically consume significant die area and increase the I/O pad capacitance. Described herein is a non-linear termination approach that may significantly reduce the power/area/pad capacitance cost while preserving the benefits of a linear CCT.

Figure 2A:
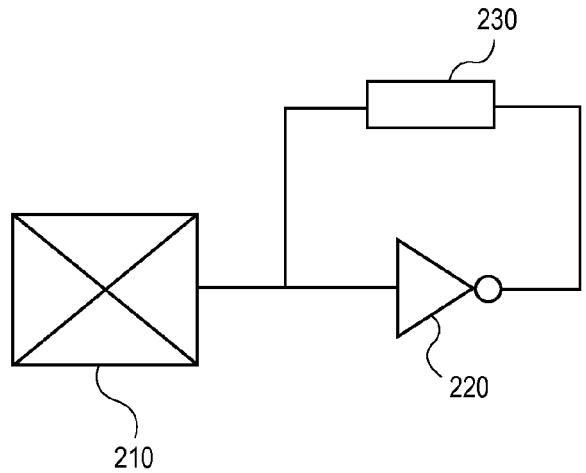
FIG. 2a is a circuit diagram of a first embodiment of a feedback inverter termination (FIT) scheme.

FIG. 2a is a circuit diagram of a first embodiment of a feedback inverter termination (FIT) scheme. The FIT of FIG. 2a has a non-linear current-voltage (I-V) characteristic to provide a voltage-dependent resistance that may be used for termination purposes.

Pad 210 provides an electrical interface with a remote portion of, for example, an interface (not illustrated in FIG. 2). Pad 210 may be coupled with FIT, which includes inverter 220 (e.g., a CMOS inverter) and resistive element 230 coupled to provide feedback to inverter 220.

Figure 2B:
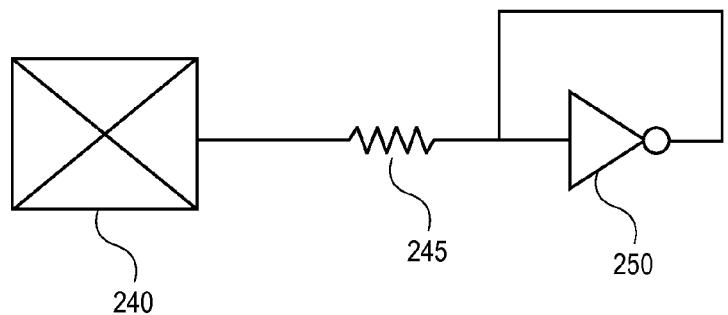
FIG. 2b is a circuit diagram of a second embodiment of a feedback inverter termination (FIT) scheme.

FIG. 2b is a circuit diagram of a second embodiment of a feedback inverter termination (FIT) scheme. The FIT of FIG. 2b has a non-linear current-voltage (I-V) characteristic to provide a voltage-dependent resistance that may be used for termination purposes.

Pad 240 provides an electrical interface with a remote portion of, for example, an interface (not illustrated in FIG. 2b). Pad 240 may be coupled with FIT, which includes inverter 250 (e.g., a CMOS inverter) and resistor 245 with inverter 250 coupled to provide feedback to from the output of inverter 250 to the input of inverter 250.

Figure 2C:
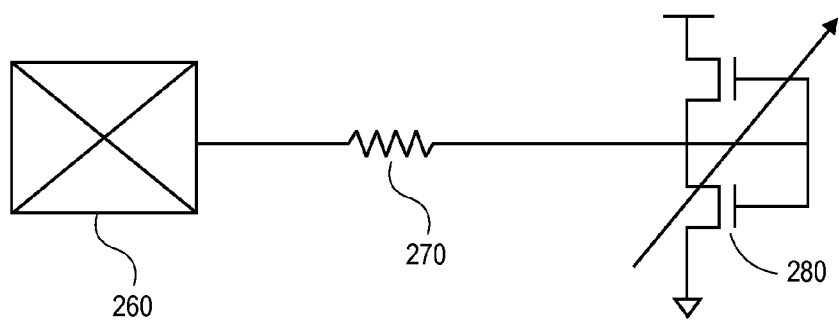
FIG. 2c is a circuit diagram of a third embodiment of a feedback inverter termination (FIT) scheme.

FIG. 2c is a circuit diagram of a first embodiment of a feedback inverter termination (FIT) scheme. The FIT of FIG. 2c has a non-linear current-voltage (I-V) characteristic to provide a voltage-dependent resistance that may be used for termination purposes.

Pad 260 provides an electrical interface with a remote portion of, for example, an interface (not illustrated in FIG. 2c). Pad 260 may be coupled with FIT, which includes resistor 270 coupled with and adjustable inverter 280 that may provide varying impedances.

Figure 3:
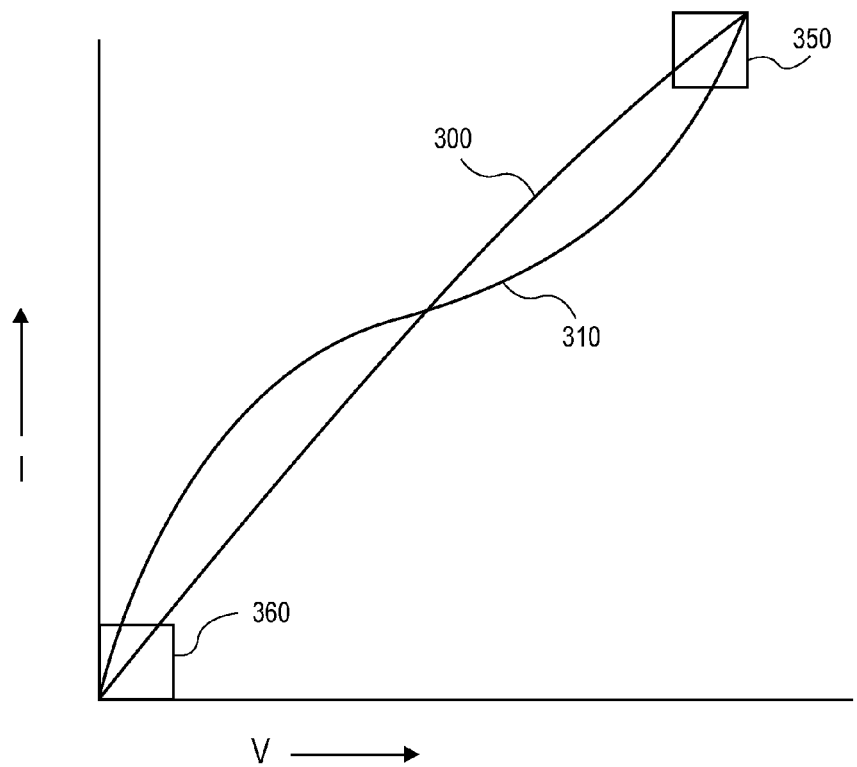
FIG. 3 provides an example resistance characteristic of a FIT scheme.

FIG. 3 provides an example resistance characteristic of a FIT scheme. The large signal resistance is at a maximum at approximately Vcc/2 and decreases as the voltage approaches the supply rail values. This type of variation may be advantageous in source-series terminated (SST) links, which may be used, for example, in the interface of FIG. 1.

Line 300 provides a linear I-V characteristic, for reference purposes. Line 310 represents a non-linear I-V characteristic, such as may be provided by the FIT scheme described herein. Boxes 350 and 360 indicate the smaller resistance values corresponding to 0/Vcc.

When an incident wave arrives at the receiver, the value is approximately Vcc/2 due to voltage division between the driver termination and the channel characteristic impedance. At this value, the receiver large signal termination resistance is at a maximum, maximizing the reflection and speeding the transition to the full supply rail value. Once the signal has settled close to 0/Vcc, the small signal resistance is smaller, which mitigates further reflections and reduces undershoot/overshoot.

Thus, the termination scheme described herein takes advantage of the inherently non-linear I-V characteristics of MOS devices to achieve the benefits of receiver CCT to reduce the termination power/area, while maintaining the signal integrity benefits provided by conventional CCT. Thus, the scheme described herein may be used to reduce the termination power in I/O links that may use CCT. It is particularly well suited to the interface of FIG. 1 and other SST I/O interfaces that require only weak termination to improve signal integrity and reduce overshoot/undershoot. FIT may also significantly reduce the area and pad capacitance impact of CCT because it can be implemented using only active devices without relying on area-intensive passive devices.

Mobile, small form factor devices (e.g., thin laptops, tablets, smart phones) generally allocate limited power to chips due to thermal and battery life constraints. Conventional interfaces require significant power as compared to the interfaces described herein. The interfaces may be used to couple multiple chips and/or provide multiple links with in a MCP. The individual interfaces may be of varying widths, speeds and/or protocols (e.g., memory or non-memory), while using a common physical layer architecture.

Figure 4:
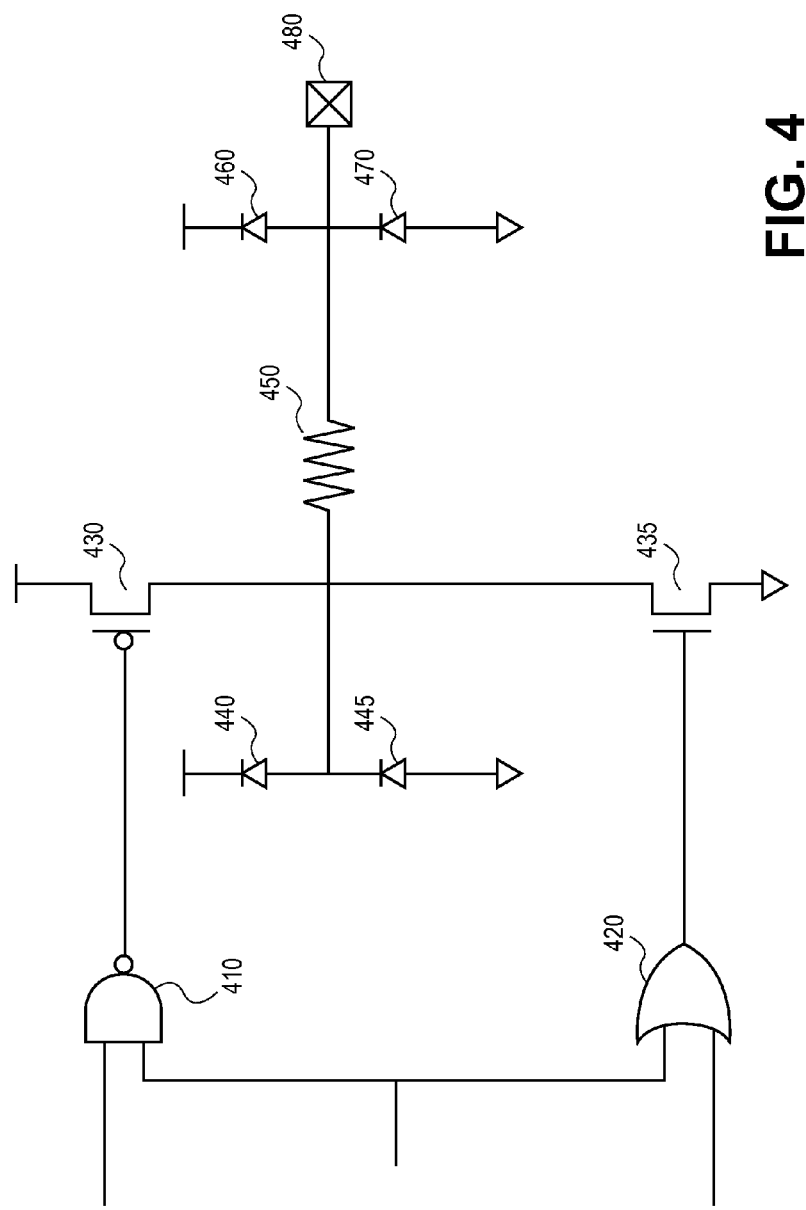
FIG. 4 is s circuit diagram of one embodiment of a distributed electrostatic discharge (ESD) protection scheme.

FIG. 4 is s circuit diagram of one embodiment of a distributed electrostatic discharge (ESD) protection scheme. The scheme of FIG. 4 may be used to provide a reduced level of ESD protection (e.g., 70 V vs. 240 V) as compared to traditional ESD schemes. The reduced level of ESD protection may be sufficient because the interface to be protected may only be subject to an ESD event during the manufacturing/assembly process. With appropriate protections during the manufacturing/assembly process, this level of ESD protection may be sufficient. The circuitry used to provide the reduced level of ESD protection may result in smaller ESD circuitry, which may provide lower pad capacitance and higher operational frequencies.

Various embodiments of the ESD scheme described herein may be distributed. Conventional ESD protection lumps ESD diodes at the pad being protected. The pad capacitance from these devices is typically a very large portion of the total pad capacitance, which can reduce transmission bandwidth.

To overcome these bandwidth-limiting issues, a more complex architecture may be used, for example, transmitter and/or receiver equalization. A typical driver consists of transistors coupled with linear resistors coupled with the pad. The linear resistors provide some IR drop to the transistors in case of an ESD event, but the more typical use is to provide a more linear impedance looking back to the driver.

The concept illustrated in FIG. 4 is to move some of the ESD protection from the pad to the transistor-resistor interface, which may function to increase the overall transmission bandwidth and may provide a more steady small signal impedance profile looking back to the pad.

In one embodiment, a variable size, segmented driver architecture is utilized. Impedance controller drivers may be built from multiple parallel segments. Impedance compensation for process/temperature variations may be provided by turning on/off parallel segments to achieve the desired driver impedance. Designing for process variation typically requires a fairly large driver in order to provide the impedance range desired.

Slow corner may require more (e.g., twice as many) segmented driver legs to provide the same impedance as fast corner. Large drivers add capacitance and reduce bandwidth. Impedance curves follow a 1/x distribution, so low range impedance values tend to require many more parallel driver legs, especially in slow corner. Using a variable size segmented driver can increase the driver impedance range with a smaller overall driver.

A simple case can be to use a second driver slice at R/2 (where R is the resistance used for the first driver slice) and only place these second driver slices at the end. This allows fast and slow corners to look the same as before, but in the slow process corner the reduce resistance legs can be used. This could allow for reduced transmitter buffer size and can enable at reduction in transmitter size, reduced pad capacitance, bandwidth improvement and/or overall performance improvement.

In the example of FIG. 4, logic gates 410 and 420 are coupled with the gates of transistors 430 and 435, respectively. Transistors 430 and 435 are coupled between the high and low supply voltages. Resistor 450 is coupled between transistors 430 and 435 and pad 480. The resistance value of resistor 450 is the R value used with respect to the resistance of the driver slice.

Diodes 440, 445, 460 and 470 operate to provide ESD protection to pad 480. By distributing multiple diodes, the diodes closest to pad 480 (i.e., diodes 460 and 470) may be smaller, and provide lower pad capacitance, which may improve the bandwidth that may be provided through pad 480.

Figure 5:
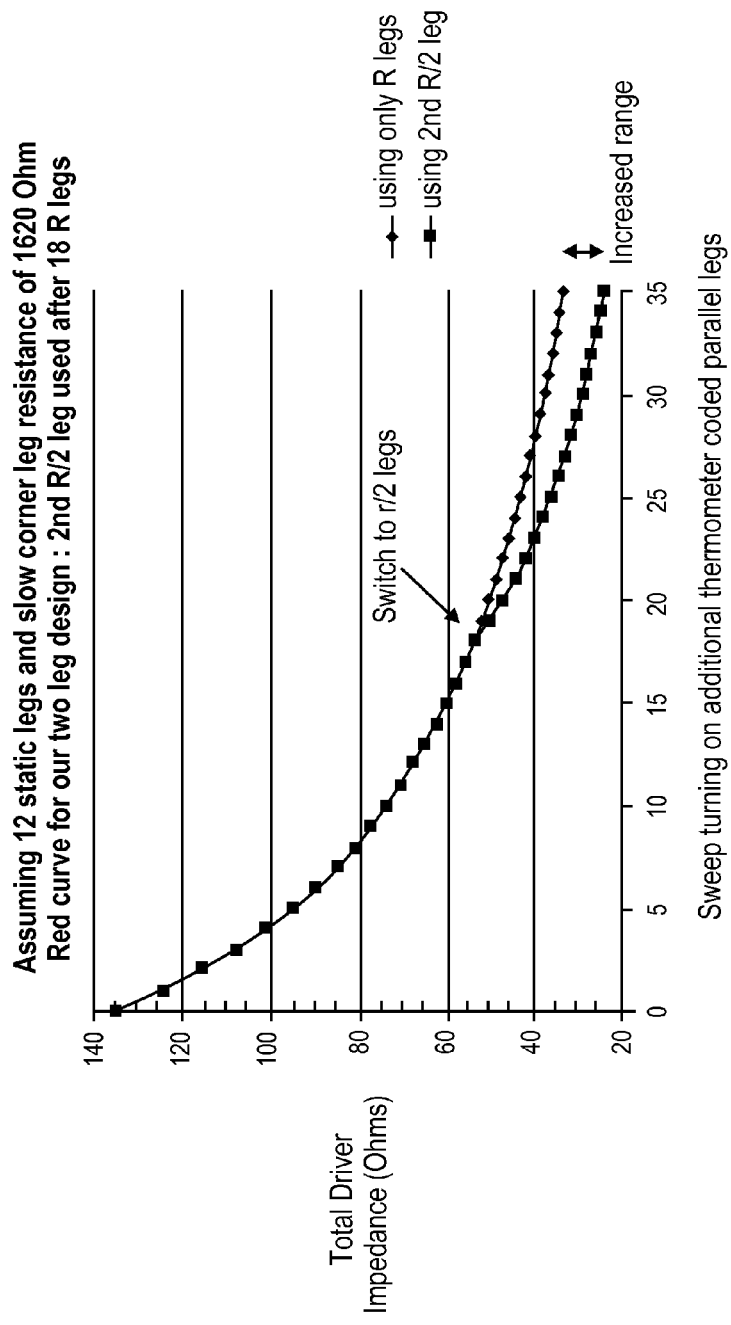
FIG. 5 is a graph of impedance values using driver slices for both drivers with single resistance values and two resistance values.

FIG. 5 is a graph of impedance values using driver slices for both drivers with single resistance values and two resistance values. The example of FIG. 5 is based on use of R and R/2; however, any number of resistance values and any relationship between the resistance values can be used.

In the example of FIG. 5, if the target impedance is 35 ohms, 35 legs may be required using only a single R value. With the addition of R/2 legs, only 27 legs are necessary. The point at which legs are switched from the first resistance value to the second allows the designer to select the inflection point as well as the granularity around the target impedance value.

Figure 6:
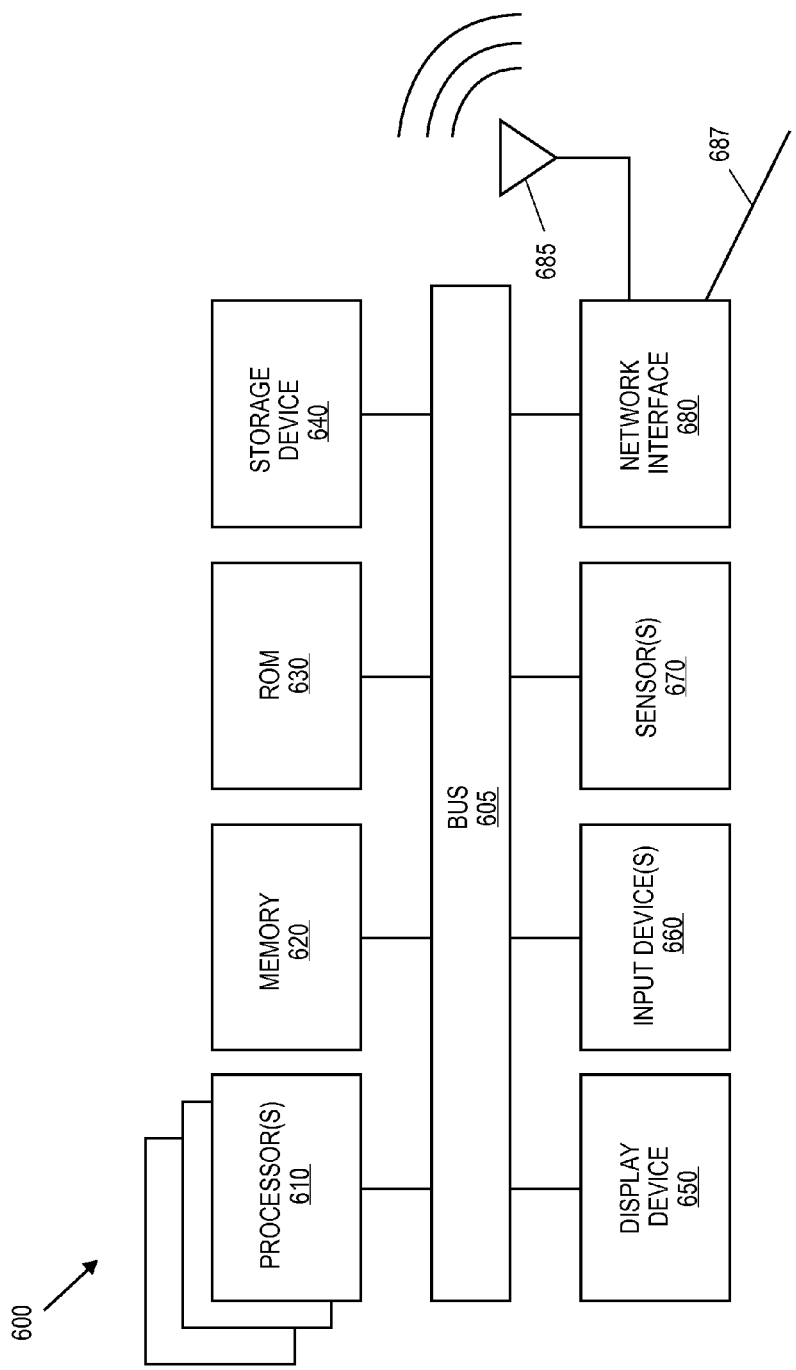
FIG. 6 is a block diagram of one embodiment of an electronic system.

FIG. 6 is a block diagram of one embodiment of an electronic system. The electronic system illustrated in FIG. 6 is intended to represent a range of electronic systems (either wired or wireless) including, for example, a tablet device, a smartphone, a desktop computer system, a laptop computer system, a server etc. Alternative electronic systems may include more, fewer and/or different components.

One or more of the components illustrated in FIG. 6 may be interconnected utilizing the OPIO architectures described herein. For example, multiple processor chips may be interconnected, or a processor and a cache memory or dynamic random access memory, etc.

Electronic system 600 includes bus 605 or other communication device to communicate information, and processor(s) 610 coupled to bus 605 that may process information. Electronic system 600 may include multiple processors and/or co-processors. Electronic system 600 further may include random access memory (RAM) or other dynamic storage device 620 (referred to as memory), coupled to bus 605 and may store information and instructions that may be executed by processor 610. Memory 620 may also be used to store temporary variables or other intermediate information during execution of instructions by processor(s) 610.

Electronic system 600 may also include read only memory (ROM) and/or other static storage device 630 coupled to bus 605 that may store static information and instructions for processor 610. Data storage device 640 may be coupled to bus 605 to store information and instructions. Data storage device 640 such as a magnetic disk or optical disc and corresponding drive may be coupled to electronic system 600.

Electronic system 600 may also be coupled via bus 605 to display device 650, which can be any type of display device, to display information to a user, for example, a touch screen. Input device 660 may be any type of interface and/or device to allow a user to provide input to electronic system 600. Input device may include hard buttons and/or soft buttons, voice or speaker input, to communicate information and command selections to processor(s) 610.

Electronic system 600 may further include sensors 670 that may be used to support functionality provided by Electronic system 600. Sensors 670 may include, for example, a gyroscope, a proximity sensor, a light sensor, etc. Any number of sensors and sensor types may be supported.

Electronic system 600 further may include network interface(s) 680 to provide access to a network, such as a local area network. Network interface(s) 680 may include, for example, a wireless network interface having antenna 685, which may represent one or more antenna(e). Network interface(s) 680 may also include, for example, a wired network interface to communicate with remote devices via network cable 687, which may be, for example, an Ethernet cable, a coaxial cable, a fiber optic cable, a serial cable, or a parallel cable.

In one embodiment, network interface(s) 680 may provide access to a local area network, for example, by conforming to IEEE 802.11b and/or IEEE 802.11g and/or IEEE 802.11n standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 6: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 680 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
 an input/output (I/O) pad;
 a first pair of diodes coupled with the pad and between a supply voltage and a ground potential;
 a resistive element coupled to the pad and with a second pair of diodes coupled between the supply voltage and the ground potential;
 a first set of single-ended transmitter circuits on a first die;
 a first set of single-ended receiver circuits on a second die, wherein the receiver circuits have a termination circuit comprising an inverter and a resistive feedback element; and
 a plurality of conductive lines between the first set of transmitter circuits and the first set of receiver circuits, wherein the lengths of the plurality of conductive lines are matched.

2. The apparatus of claim 1 further comprising:
 a second set of single-ended transmitter circuits on the second die;
 a second set of single-ended receiver circuits on the first die, wherein the receiver circuits have a termination circuit comprising an inverter and a resistive feedback element; and
 a plurality of conductive lines between the second set of transmitter circuits and the second set of receiver circuits, wherein the lengths of the plurality of conductive lines are matched.

3. The apparatus of claim 1, wherein the first die comprises at least a processor core, the apparatus further comprising a touch screen interface coupled with the processor core.

4. The apparatus of claim 1 wherein the first die, the second die and the plurality of conductive lines are all disposed within a single integrated circuit package.

5. A tablet computing device comprising:
 a touch screen interface;
 a first set of single-ended transmitter circuits on a first die;
 a first set of single-ended receiver circuits on a second die, wherein the receiver circuits have a termination circuit comprising an inverter and a resistive feedback element; and
 a plurality of conductive lines between the first set of transmitter circuits and the first set of receiver circuits, wherein the lengths of the plurality of conductive lines are matched.

6. The tablet of claim 5, further comprising:
 a second set of single-ended transmitter circuits on the second die;
 a second set of single-ended receiver circuits on the first die, wherein the second set of receiver circuits have a termination circuit comprising an inverter and a resistive feedback element; and
 a second plurality of conductive lines between the second set of transmitter circuits and the second set of receiver circuits, wherein the lengths of the second plurality of conductive lines are matched.

7. The tablet of claim 5 wherein the first die, the second die and the plurality of conductive lines are all disposed within a single integrated circuit package.

8. A system comprising:
 an omnidirectional antenna;
 an input/output (I/O) pad;
 a first pair of diodes coupled with the pad and between a supply voltage and a ground potential;
 a resistive element coupled to the pad and with a second pair of diodes coupled between the supply voltage and the ground potential;
 a first set of single-ended transmitter circuits on a first die;
 a first set of single-ended receiver circuits on a second die, wherein the receiver circuits have a termination circuit comprising an inverter and a resistive feedback element; and
 a plurality of conductive lines between the first set of transmitter circuits and the first set of receiver circuits, wherein the lengths of the plurality of conductive lines are matched.

9. The system of claim 8, wherein the first die comprises at least a processor core, the system further comprising a touch screen interface coupled with the processor core.

10. The system of claim 8 wherein the first die, the second die and the plurality of conductive lines are all disposed within a single integrated circuit package.

11. The system of claim 10 wherein the use of smaller and distributed ESD protection diodes significantly reduces I/O pad capacitance to improve bandwidth.

12. The system of claim 8 further comprising:
 a second set of single-ended transmitter circuits on the second die;
 a second set of single-ended receiver circuits on the first die, wherein the second set of receiver circuits have a termination circuit comprising an inverter and a resistive feedback element; and
 a second plurality of conductive lines between the second set of transmitter circuits and the second set of receiver circuits, wherein the lengths of the second plurality of conductive lines are matched.

* * * * *